(12) United States Patent
Park

(10) Patent No.: US 11,187,976 B2
(45) Date of Patent: Nov. 30, 2021

(54) METHODS OF DETECTING PRINTING DEFECTS ON PHOTORESIST PATTERNS

(71) Applicant: SK hynix Inc., Icheon-si Gyeonggi-do (KR)

(72) Inventor: Jun Taek Park, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/017,470

(22) Filed: Sep. 10, 2020

(65) Prior Publication Data
US 2020/0409256 A1    Dec. 31, 2020

Related U.S. Application Data

(62) Division of application No. 16/427,145, filed on May 30, 2019, now Pat. No. 10,802,396.

(30) Foreign Application Priority Data

Nov. 1, 2018    (KR) .................. 10-2018-0132822

(51) Int. Cl.
| | |
|---|---|
| *G03F 1/84* | (2012.01) |
| *G06T 7/00* | (2017.01) |
| *G03F 7/20* | (2006.01) |
| *H01L 21/66* | (2006.01) |
| *G01N 21/95* | (2006.01) |
| *G01N 21/956* | (2006.01) |
| *G03F 1/86* | (2012.01) |

(52) U.S. Cl.
CPC ........... *G03F 1/84* (2013.01); *G01N 21/9501* (2013.01); *G01N 21/956* (2013.01); *G03F 1/86* (2013.01); *G03F 7/7065* (2013.01); *G03F 7/70675* (2013.01); *G06T 7/0006* (2013.01); *H01L 22/12* (2013.01); *G06T 2207/10061* (2013.01); *G06T 2207/30148* (2013.01)

(58) Field of Classification Search
CPC ............. G01N 21/9501; G01N 21/956; G03F 7/7065; G03F 7/70616; G03F 7/70675; G06T 7/0006; G06T 2207/10061; G06T 2207/30148; H01L 22/12
USPC ...... 355/30, 68, 77; 356/237.2, 237.5, 239.3
See application file for complete search history.

(56) References Cited

U.S. PATENT DOCUMENTS

| | | | |
|---|---|---|---|
| 5,808,735 | A | 9/1998 | Lee et al. |
| 2011/0129140 | A1 | 6/2011 | Kitazawa et al. |

(Continued)

FOREIGN PATENT DOCUMENTS

| | | |
|---|---|---|
| CN | 104854677 A | 8/2015 |
| CN | 106024665 A | 10/2016 |

(Continued)

*Primary Examiner* — Colin W Kreutzer
(74) *Attorney, Agent, or Firm* — William Park & Associates Ltd.

(57) ABSTRACT

A method of detecting defects of a photoresist pattern includes generating a scanning electron microscope (SEM) image of a surface of a photoresist pattern and signal intensity data relative to pixel position of the surface of the photoresist pattern. The method also includes setting a lower reference intensity threshold value and an upper reference intensity threshold value used as reference values for detecting defects. The method further includes classifying a pixel position of the signal intensity data having a signal intensity value which is less than the lower reference intensity threshold value or greater than the upper reference intensity threshold value as a defect position.

6 Claims, 22 Drawing Sheets

(56) References Cited

U.S. PATENT DOCUMENTS

2017/0139330 A1  5/2017  Hotzel et al.
2019/0277776 A1  9/2019  Gawhane

FOREIGN PATENT DOCUMENTS

| CN | 107463065 A | 12/2017 |
|----|-------------|---------|
| KR | 1020110068401 A | 6/2011 |
| KR | 1020170056472 A | 5/2017 |

METHODS OF DETECTING PRINTING DEFECTS ON PHOTORESIST PATTERNS

CROSS-REFERENCE TO RELATED APPLICATIONS

The present application is a divisional application of U.S. patent application Ser. No. 16/427,145, filed on May 30, 2019, and claims priority under 35 U.S.C 119(a) to Korean Application No. 10-2018-0132822, filed on Nov. 1, 2018, which is incorporated herein by references in its entirety.

BACKGROUND

1. Technical Field

Various embodiments of the present disclosure relate to photolithography techniques used in the fabrication of semiconductor devices and, more particularly, to methods of detecting printing defects on photoresist patterns.

2. Related Art

Various pattern transfer techniques have been used to integrate semiconductor devices on a wafer. Recently, a sub-resolution assist feature (SRAF) lithography technique has been introduced in photomasks used in a photolithography process. The SRAFs have been employed in the photomasks to act as elements for improving the resolution of pattern images transferred from a photomask onto a wafer or for improving a patterning margin.

The SRAFs may be introduced into photomasks to improve a patterning margin of the pattern images transferred from a photomask onto a wafer. Although SRAFs are employed in the photomasks, the SRAFs should not be printed in a photoresist layer coated on a wafer. However, as the difficulty and complexity of the photolithography process become greater, it has been more difficult to control the printability of SRAFs. That is, in the event that a photolithography process is performed using a photomask employing SRAFs, the SRAFs may be undesirably printed in a photoresist layer coated on a wafer, thereby causing defects of photoresist patterns.

SRAF defects of photoresist patterns may act as metrology defects of the photoresist patterns. If an etch process is performed using a photoresist pattern having a SRAF defect as an etch mask, the SRAF defect may lead to pattern defects. Accordingly, in order to prevent SRAFs from causing pattern defects, it may be necessary to measure and verify SRAF defects in photoresist patterns.

SUMMARY

According to an embodiment, a method of detecting defects of a photoresist pattern includes providing a photomask having transfer pattern regions and sub-resolution assist features (SRAFs), forming a photoresist pattern using the photomask, and generating a scanning electron microscope (SEM) image of a surface of the photoresist pattern and signal intensity data relative to pixel position of the surface of the photoresist pattern. The method also includes selecting and defining a background region on which images of the transfer pattern regions are not transferred in the SEM image, setting a lower reference intensity threshold value by subtracting a first margin from a lowest intensity value among the signal intensity data in the background region, and classifying a pixel position of the signal intensity data having a signal intensity value less than the lower reference intensity threshold value as a defect position.

According to another embodiment, a method of detecting defects of a photoresist pattern includes providing a photomask having transfer pattern regions and sub-resolution assist features (SRAFs), forming a photoresist pattern using the photomask, and scanning a surface of the photoresist pattern with a scanning electron microscope (SEM) to generate signal intensity data relative to pixel position of the surface of the photoresist pattern. The method also includes generating a histogram illustrating the number of positional pixels relative to signal intensity from the signal intensity data including information on the pixel positions, setting a signal intensity value of a first point having the minimum number of positional pixels in the histogram between a first peak region having a first highest peak point and a second peak region having a second highest peak point as a lower reference intensity threshold value, and classifying a pixel position of the signal intensity data having a signal intensity value less than the lower reference intensity threshold value as a defect position.

According to another embodiment, a method of detecting defects of a photoresist pattern includes generating a scanning electron microscope (SEM) image of a surface of a photoresist pattern and signal intensity data relative to pixel position of the surface of the photoresist pattern, setting a lower reference intensity threshold value and an upper reference intensity threshold value used as reference values for detecting the defects, and classifying a pixel position of the signal intensity data having a signal intensity value which is less than the lower reference intensity threshold value or greater than the upper reference intensity threshold value as a defect position.

DETAILED DESCRIPTION OF THE EMBODIMENTS

Figure 1:
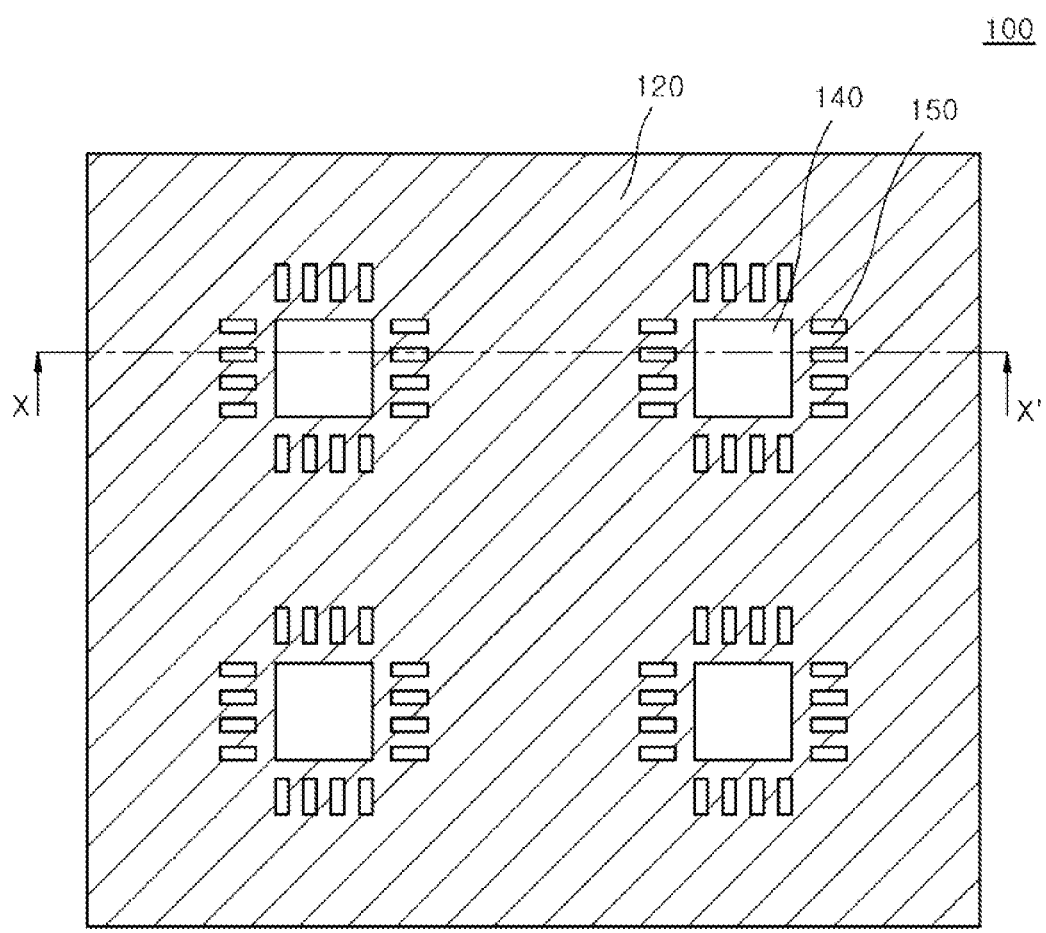
FIG. 1 is a plan view illustrating a photomask, according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence or number of elements. Thus, a first element in some embodiments could be termed a second element in other embodiments without departing from the present teachings.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

The following embodiments may be applied to realization of integrated circuits such as dynamic random access memory (DRAM) devices, phase change random access memory (PcRAM) devices or resistive random access memory (ReRAM) devices. Moreover, the following embodiments may be applied to realization of memory devices such as static random access memory (SRAM) devices, flash memory devices, magnetic random access memory (MRAM) devices, or ferroelectric random access memory (FeRAM) devices. Furthermore, the following embodiments may be applied to realization of logic devices in which logic circuits are integrated. The following embodiments may also be applied to techniques for realizing various products necessitating fine patterns.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
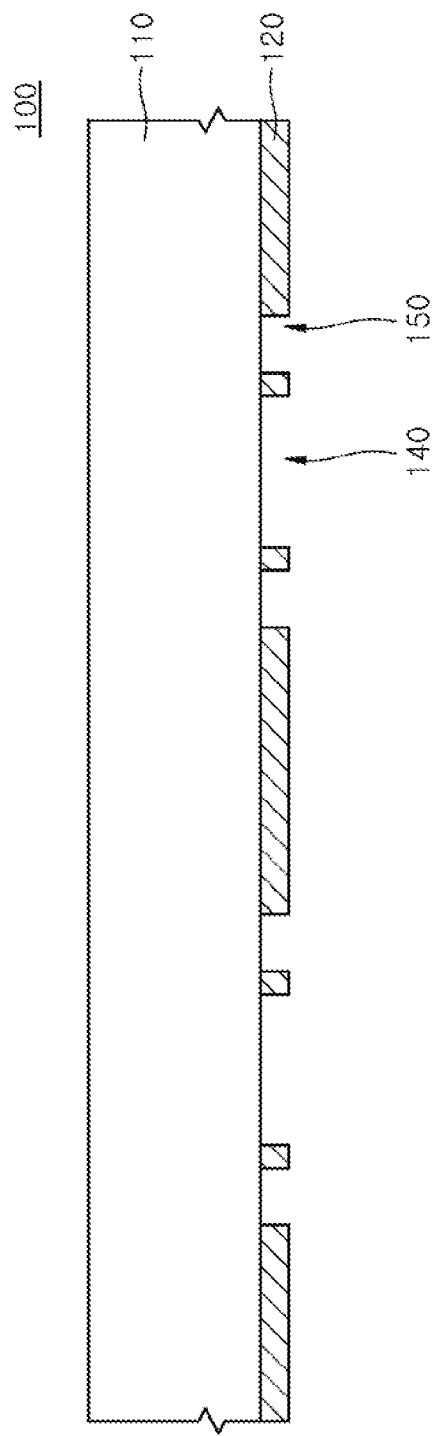
FIG. 2 is a cross-sectional view illustrating the photomask shown in FIG. 1.

FIG. 1 is a plan view illustrating a photomask 100 according to an embodiment. FIG. 2 is a cross-sectional view taken along a line X-X' of FIG. 1.

Referring to FIGS. 1 and 2, the photomask 100 may be provided to transfer pattern images onto a photoresist layer (not shown) coated on a wafer (not shown). The photomask 100 may include transfer pattern regions 140 whose images are transferred onto the photoresist layer and a mask pattern 120 defining the transfer pattern regions 140. Sub-resolution assist features (SRAFs) 150 may be disposed in a periphery region of each of the transfer pattern regions 140 to improve a resolution of an image of the transfer pattern region 140. The mask pattern 120 may be provided to define the transfer pattern regions 140 and the SRAFs 150.

Each of the transfer pattern regions 140 may have a shape corresponding to a pattern which is formed in the photoresist layer. For example, each of the transfer pattern regions 140 may have a rectangular shape to form a preliminary contact hole in the photoresist layer in a plan view. Each of the SRAFs 150 may be a fine pattern having a very small size, and some of the SRAFs 150 may be disposed to be spaced apart from any one of the transfer pattern regions 140. Each of the SRAFs 150 may have a size which is less than a resolution limit of a lithography apparatus in which the photomask 100 is loaded.

Each of the transfer pattern regions 140 may be a transparent region, and the mask pattern 120 may be an opaque region, such as a light blocking region. Each of the SRAFs 150 may also be a transparent region, like the transfer pattern regions 140. As illustrated in FIG. 2, the mask pattern 120 may be formed by forming a light blocking layer on a transparent mask substrate 110 and by patterning the light blocking layer. The mask substrate 110 may be a quartz substrate, and the mask pattern 120 may be a light blocking pattern, such as a chrome pattern.

Figure 3:
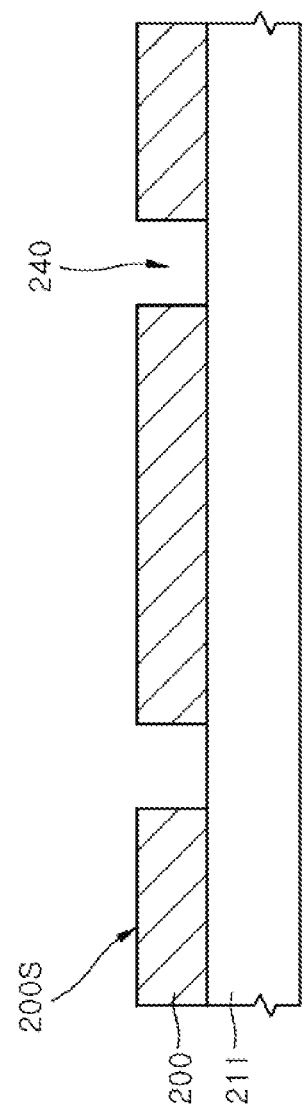
FIGS. 3 and 4 are cross-sectional views illustrating photoresist patterns formed by transferring pattern images of the photomask shown in FIG. 1 onto photoresist layers.
Figure 4:
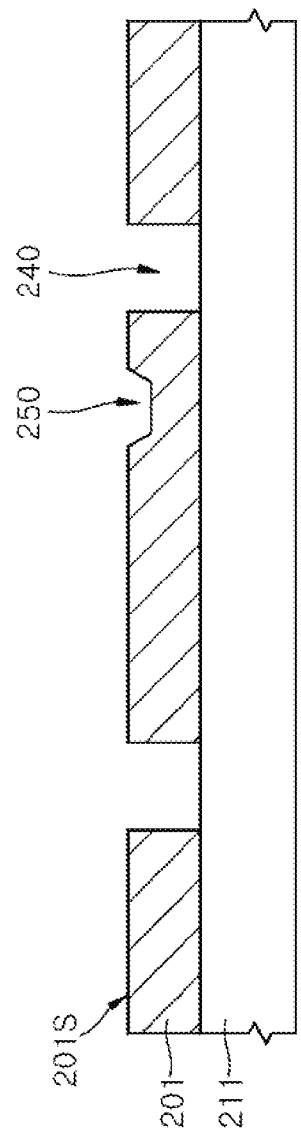

FIG. 3 is a cross-sectional view illustrating a photoresist pattern 200 formed using the photomask 100 shown in FIG. 1. FIG. 4 is a cross-sectional view illustrating a photoresist pattern 201 formed using the photomask 100 shown in FIG. 1.

Referring to FIG. 3, images of the transfer pattern regions 140 of the photomask (100 of FIG. 1) may be transferred onto a photoresist layer coated on a wafer 211 using a photolithography apparatus (not shown) to form the photoresist pattern 200 on the wafer 211. The photoresist layer in which the images of the transfer pattern regions 140 are transferred may be developed to form the photoresist pattern 200 providing preliminary contact holes 240 corresponding to the transfer pattern regions 140 of FIG. 1. That is, the preliminary contact holes 240 may be formed by transferring the images of the transfer pattern regions 140 onto the photoresist layer coated on the wafer 211 and by developing the photoresist layer. In such a case, the SRAFs (150 of FIG. 1) may be helpful to accurately transfer the images of the transfer pattern regions 140 onto the photoresist layer. That is, when the images of the transfer pattern regions 140 are transferred onto the photoresist layer on the wafer 211, a resolution of the images of the transfer pattern regions 140 may be improved due to the presence of the SRAFs (150 of FIG. 1). In such a case, the exposure process for transferring the images of the transfer pattern regions 140 onto the photoresist layer may be accurately controlled such that images of the SRAFs (150 of FIG. 1) are not transferred onto a surface 200S of the photoresist layer.

Referring to FIG. 4, images of various patterns included in the photomask (100 of FIG. 1) may be transferred onto a photoresist layer coated on the wafer 211, thereby forming a photoresist pattern 201 on the wafer 211. In such a case, the images of the SRAFs (150 of FIG. 1) included in the photomask (100 of FIG. 1) may be undesirably transferred onto the photoresist layer to cause formation of printing defects 250 at a surface 201S of the photoresist layer after a development process. If the exposure process for transferring the images of various patterns included in the photomask (100 of FIG. 1) onto the wafer 211 is not accurately controlled, the printing defects 250 may be formed in the photoresist pattern 201, as illustrated in FIG. 4. If the photoresist pattern 201 including the printing defects 250 is used as an etch mask in a subsequent etch process, an etch target layer (not shown) on the wafer 211 may be abnormally etched to cause a pattern failure.

The present disclosure may provide methods of verifying formation of the printing defects 250 or detecting information on positions of the printing defects 250 by using data about pixel signal intensity of SEM images.

Figure 5:
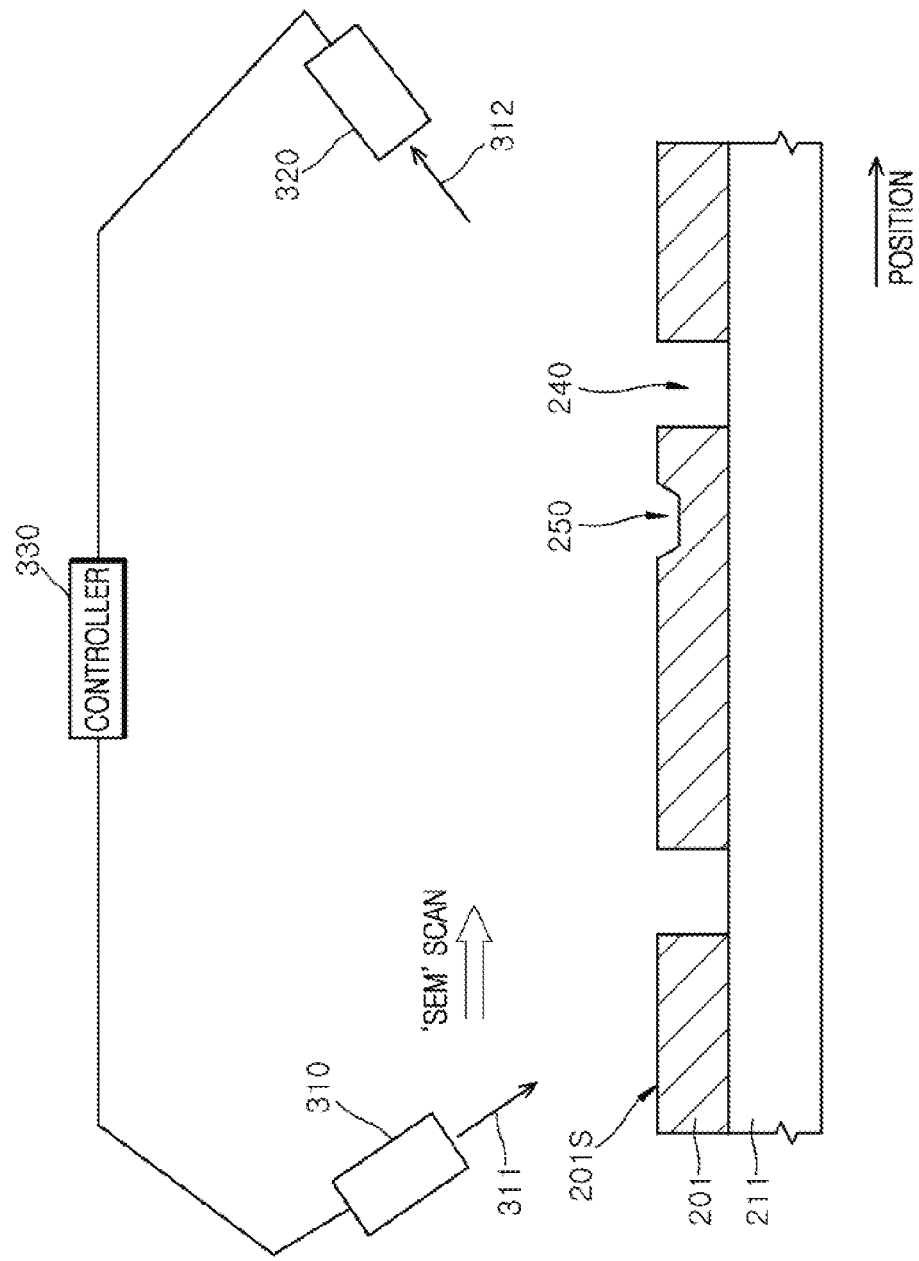
FIG. 5 is a schematic view illustrating a scanning process for obtaining an image of a photoresist pattern with a scanning electron microscope (SEM).
Figure 6:
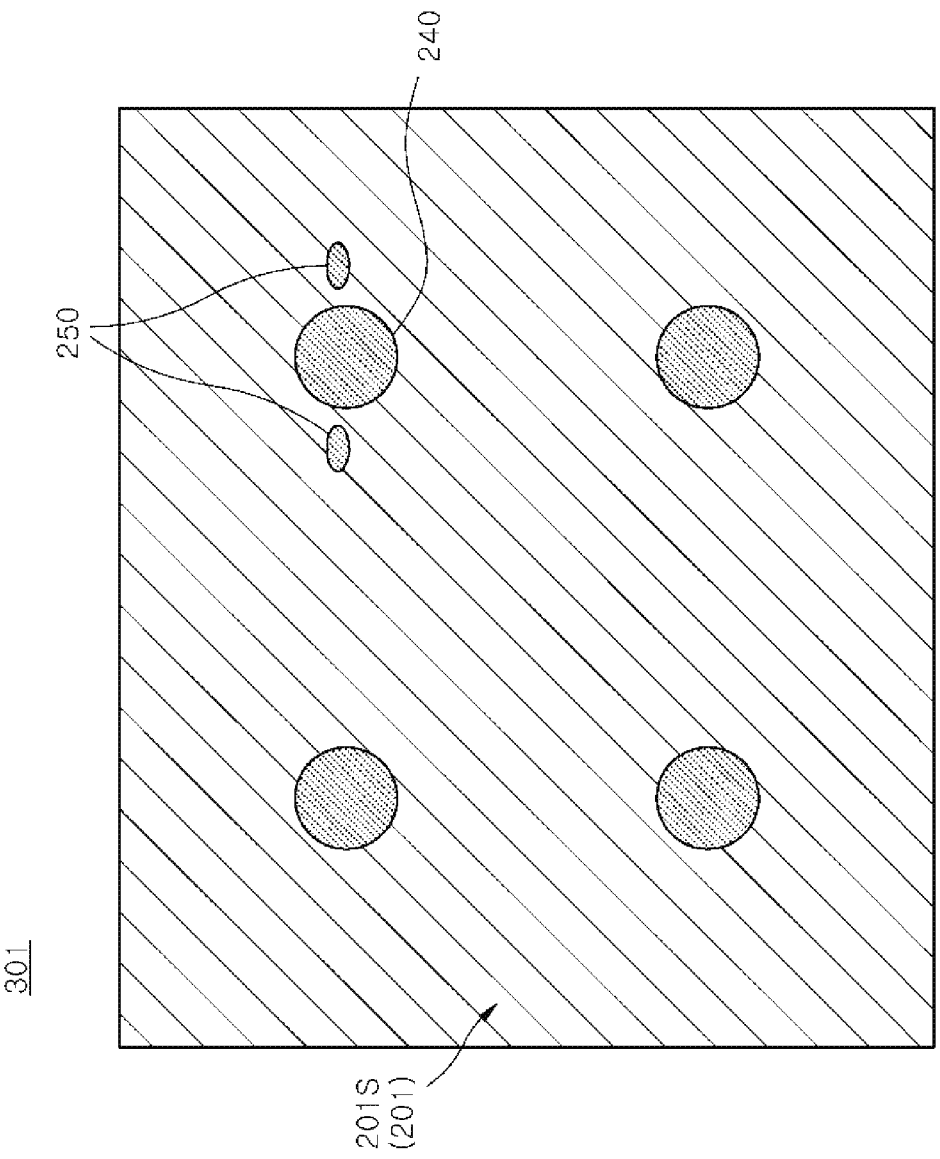
FIGS. 6 and 7 are schematic views illustrating SEM images of a surface of a photoresist pattern formed according to an embodiment.

FIG. 5 is a schematic view illustrating a scanning process for obtaining an image of the photoresist pattern 201 of FIG. 4 with a scanning electron microscope (SEM). FIG. 6 is a SEM image of a surface of the photoresist pattern 201 of FIG. 4.

Referring to FIG. 5, the SEM may scan the surface 201S of the photoresist pattern 201 shown in FIG. 4 to collect data about pixel signal intensity of a SEM image (301 of FIG. 6). The SEM may be configured to include an electronic optical system 310 having an electron gun, a detector 320 disposed to correspond to the electronic optical system 310, and a controller 330 controlling operations of the electronic optical system 310 and the detector 320.

The electronic optical system 310 may generate a primary electron beam 311 to scan the surface 201S of the photoresist pattern 201. The detector 320 may collect secondary electrons 312 emitted from the surface 201S of the photoresist pattern 201. The controller 330 may record a scanning position of the primary electron beam 311 irradiated onto the surface 201 of the photoresist pattern 201 as a pixel position of the SEM image and may also record an intensity of the secondary electrons collected by the detector 320 as a pixel intensity of the SEM image relative to the pixel position. The primary electron beam 311 may scan an entire portion of the surface 201S of the photoresist pattern 201 or an entire portion of the wafer 211 on which the photoresist pattern 201 is formed, thereby collecting intensities of the secondary electrons 312 according to the pixel positions. The controller 330 may generate signal data of the pixel intensity according to the collected pixel positions and may provide an SEM image using the signal data of the pixel intensity.

An SEM image 301 obtained by scanning the surface 201S of the photoresist pattern 201 with an SEM may be the same image as schematically illustrated in FIG. 6. The photoresist pattern 201 may include the preliminary contact holes 240 formed by an exposure process for transferring the images of the photomask (100 of FIG. 1) onto a photoresist layer on the wafer 211 and by a development process for pattering the exposed photoresist layer. Each of the preliminary contact holes 240 is shown as a shaded region which is relatively darker than the surface 201S of the photoresist pattern 201, when viewed from the SEM image 301 of FIG. 6. Each of the printing defects 250 formed at the surface 201S of the photoresist pattern 201 is also shown as a shaded region which is relatively darker than the surface 201S of the photoresist pattern 201, as illustrated in FIG. 6. Accordingly, the printing defects 250 on the SEM image 301 of FIG. 6 may be detected or observed by human eyes of inspectors. However, detecting the printing defects 250 on the SEM image 301 with human eyes may require significant time and effort and may be subject to oversight, for example, due to fatigue. This can lead to a reduction in productivity when manufacturing semiconductor devices. Such disadvantages can be mitigated or avoided by objectively detecting the printing defects 250 on the SEM image 301 using an automated system in order to improve manufacturing productivity of the semiconductor devices.

The present disclosure may provide methods of extracting or detecting the printing defects 250 by using the pixel signal intensity data which are collected to provide the SEM image.

Figure 7:
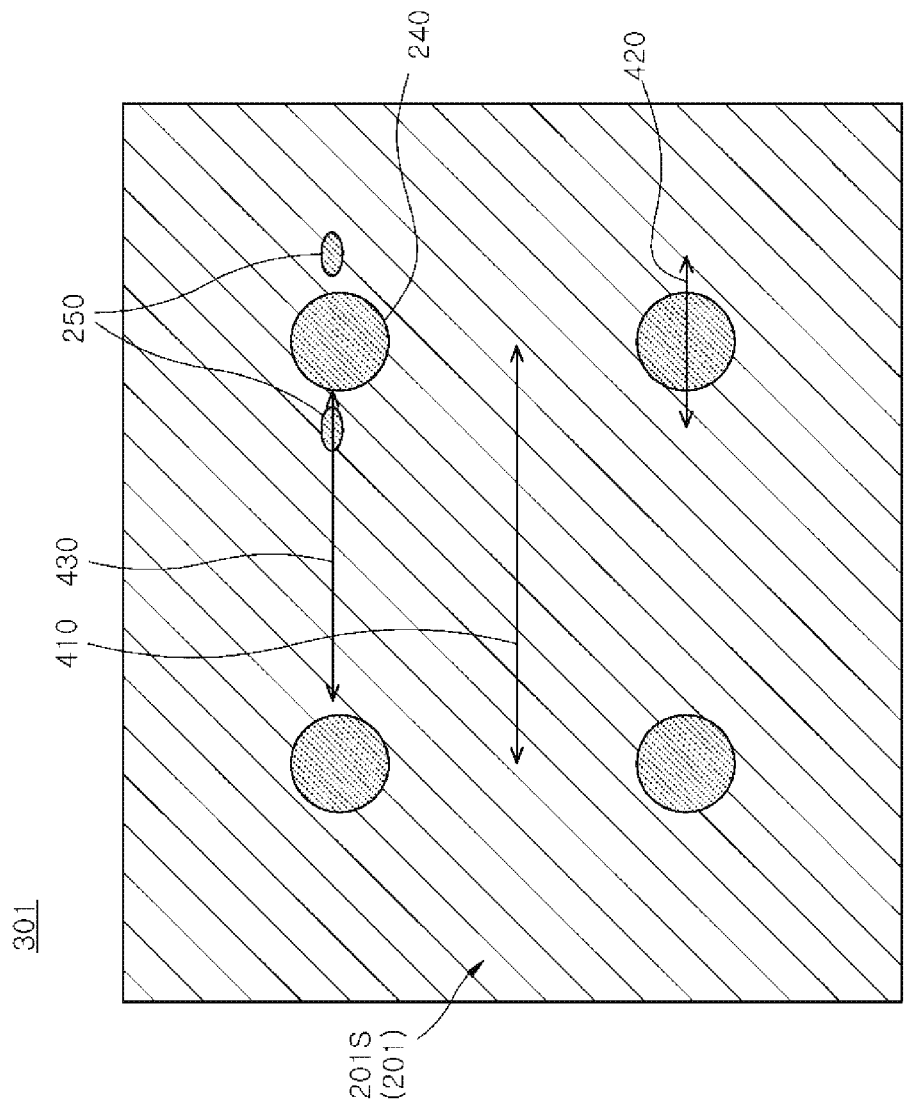
Figure 8:
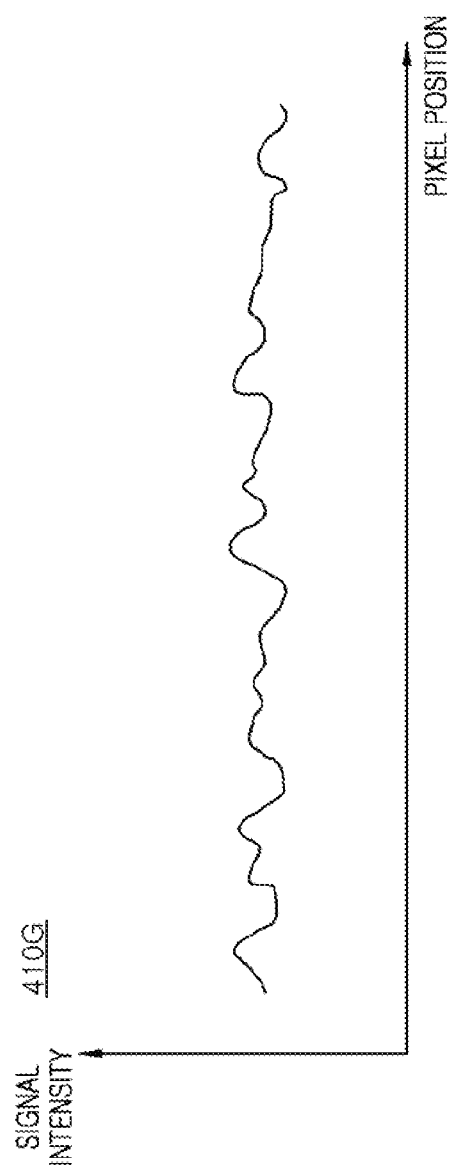
FIGS. 8 to 10 are graphs illustrating a signal intensity of an SEM relative to a position of pixels formed according to an embodiment.
Figure 9:
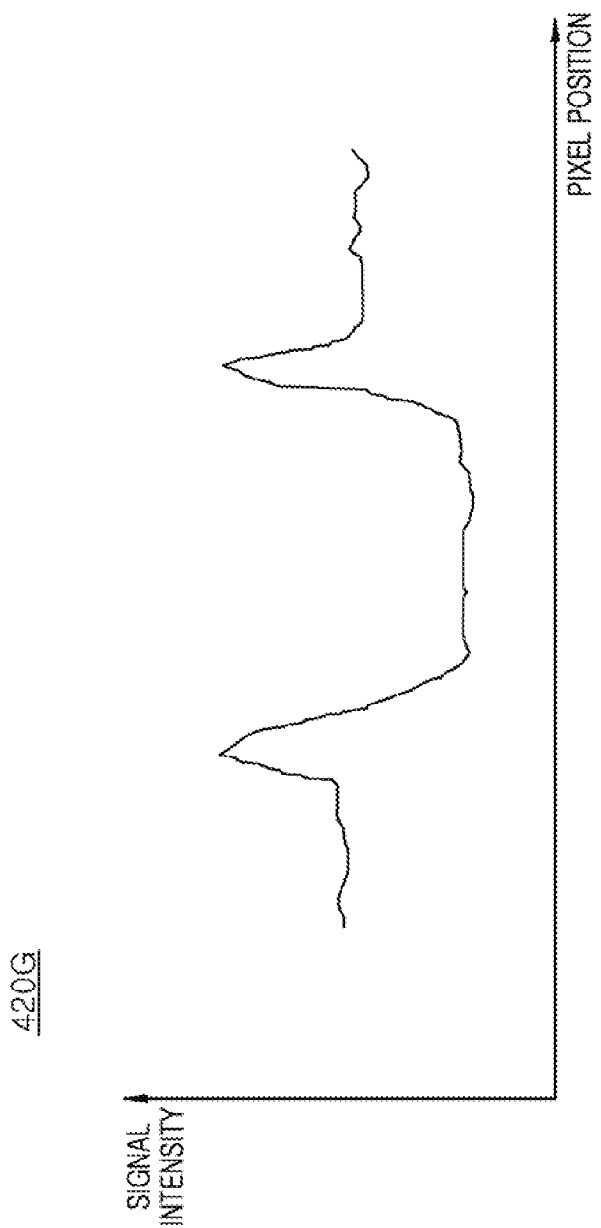
Figure 10:
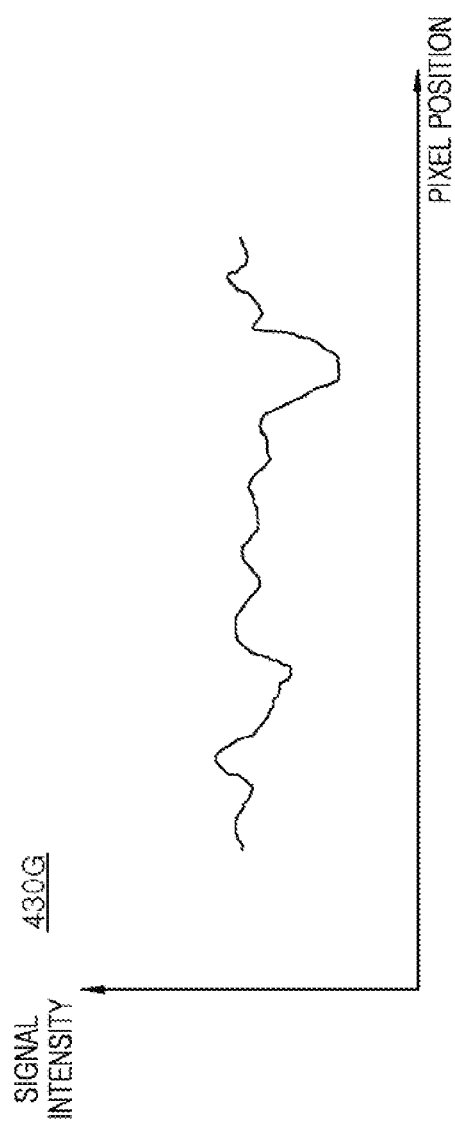

FIG. 7 is a schematic view illustrating first to third regions 410, 420, and 430 which are distinct from each other in the SEM image 301 of FIG. 6. FIGS. 8 to 10 are graphs illustrating a signal intensity detected in the first to third regions 410, 420, and 430 of the SEM image 301 shown in FIG. 7. In each of the graphs of FIGS. 8 to 10, the abscissa represents a pixel position and the ordinate represents a signal intensity.

Referring to FIG. 7, the first to third regions 410, 420, and 430 are distinct from each other and illustrated for the purpose of ease and convenience in explanation. The first region 410 may be set as regions between rows in which the preliminary contact holes 240 are arrayed. The first region 410 may be a region in which no transfer pattern is substantially disposed, and none of the printing defects 250 are detected in the first region 410. The first region 410 may be a background region on which none of pattern images are transferred. A distribution of a signal intensity at the positions of the pixels detected in the first region 410, that is, a pixel signal intensity of the first region 410, may be expressed as a graph 410G illustrated in FIG. 8. The graph 410G illustrated in FIG. 8 may include variation which is due to only noise.

The second region 420 may correspond to a region in which the preliminary contact hole 240 is located. The second region 420 may be a region including the preliminary contact hole 240 which is formed by transferring the image of the transfer pattern region (140 of FIG. 1) of the photomask (100 of FIG. 1). A distribution of a signal intensity at the positions of the pixels detected in the second region 420, that is, a pixel signal intensity of the second region 420, may be expressed as a graph 420G illustrated in FIG. 9. The graph 420G illustrated in FIG. 9 may include a valley having a relatively low intensity and a pair of peak regions located at both ends of the valley having a relatively high intensity.

The third region 430 may be a region located between the preliminary contact holes 240. Thus, the third region 430 may include the printing defect 250 formed due to the SRAF (150 of FIG. 1) of the photomask (100 of FIG. 1). A distribution of a signal intensity at the positions of the pixels detected in the third region 430, that is, a pixel signal intensity of the third region 430, may be expressed as a graph 430G illustrated in FIG. 10. The graph 430G illustrated in FIG. 10 may include a dip having a relatively low intensity.

It may be difficult to correctly detect a signal intensity dip, also referred to as a valley, corresponding to the printing defect 250 from the graphs 410G, 420G, and 430G of FIGS. 8, 9 and 10 by intuition. Thus, the present disclosure may provide methods of setting a reference intensity value for detecting a signal intensity dip corresponding to the printing defect 250.

Figure 11:
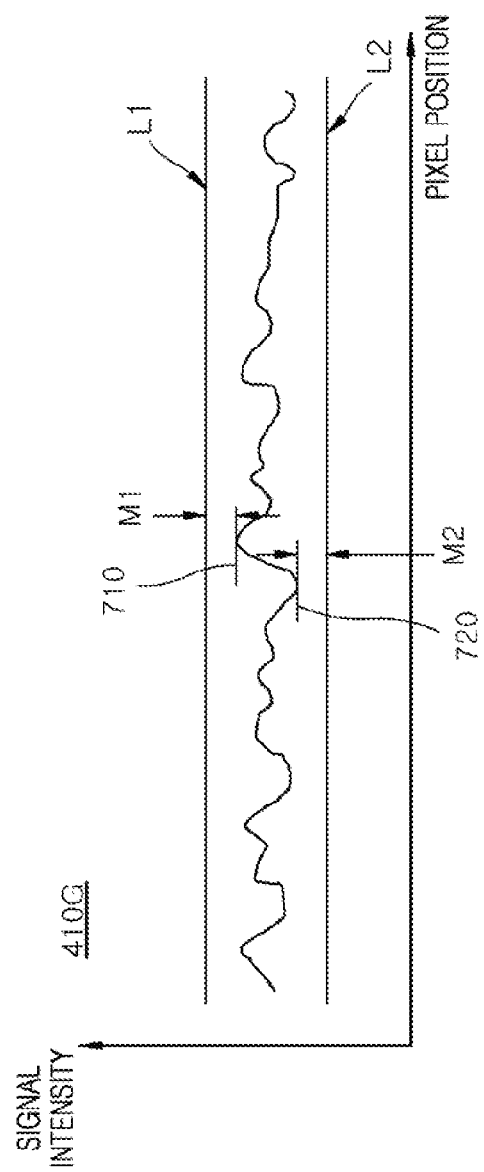
FIG. 11 is a graph illustrating a method of determining a reference signal intensity of an SEM for detecting a printing defect of a photoresist pattern formed according to an embodiment.

FIG. 11 is a graph illustrating a method of setting a reference intensity value for detecting the printing defect (250 of FIG. 7) according to an embodiment.

Referring to FIG. 11, a reference intensity value may be determined using the graph 410G of FIG. 8 detected from the first region (410 of FIG. 7) corresponding to a background region in which no pattern is present. The first region (410 of FIG. 7) may be a region in which the preliminary contact hole (240 of FIG. 7) as well as the printing defect (250 of FIG. 7) are absent. The pixel signal intensity values obtained from the SEM scan over the first region 410 may be regarded as signal intensity values of the background region (i.e., background signal intensity values). That is, the pixel signal intensity values obtained from the SEM scan over the first region 410 may be regarded as signal intensity values representing the flat surface 200S of the photoresist pattern (200 of FIG. 3) without the printing defect 250 or the preliminary contact hole 240.

In the graph 410G obtained from the SEM scan over the first region 410, an intensity value 710 of a highest peak may be set as a preliminary upper reference intensity threshold value and an intensity value 720 of a lowest valley may be set as a preliminary lower reference intensity threshold value. An upper reference intensity threshold value L1 may be set by adding a first margin M1 having a certain value to the intensity value 710 corresponding to the preliminary upper reference intensity threshold value. A lower reference intensity threshold value L2 may be set by subtracting a second margin M2 having a certain value from the intensity value 720 corresponding to the preliminary lower reference intensity threshold value. The first margin M1 and the second margin M2 may be set to have an arbitrary value. The first margin M1 and the second margin M2 may be set to have a value corresponding to between 1% to 10% of an average value of the pixel signal intensity values obtained from the SEM scan over the first region 410. Because the upper reference intensity threshold value L1 is set by adding the first margin M1 to the highest intensity value 710 and the lower reference intensity threshold value L2 is set by subtracting the second margin M2 from the lowest intensity value 720, all of the signal intensity values detected from the background region may be regarded as the signal intensity values of a flat surface of a normal photoresist pattern even though some noises are included in the graph 410G.

Defects such as the printing defects (250 of FIG. 7) may be detected by applying the upper reference intensity threshold value L1 and the lower reference intensity threshold value L2 to the graphs 410G, 420G, and 430G illustrated in FIGS. 8, 9, and 10 obtained from the SEM san over the first, second, and third regions 410, 420, and 430. For example, if all of the pixel signal intensity values of the graph 410G are distributed within a range between the upper reference intensity threshold value L1 and the lower reference intensity threshold value L2 as illustrated in FIG. 11, the first region (410 of FIG. 7) providing the graph 410G may be regarded as a region in which no printing defect (250 of FIG. 6) is formed.

Figure 12:
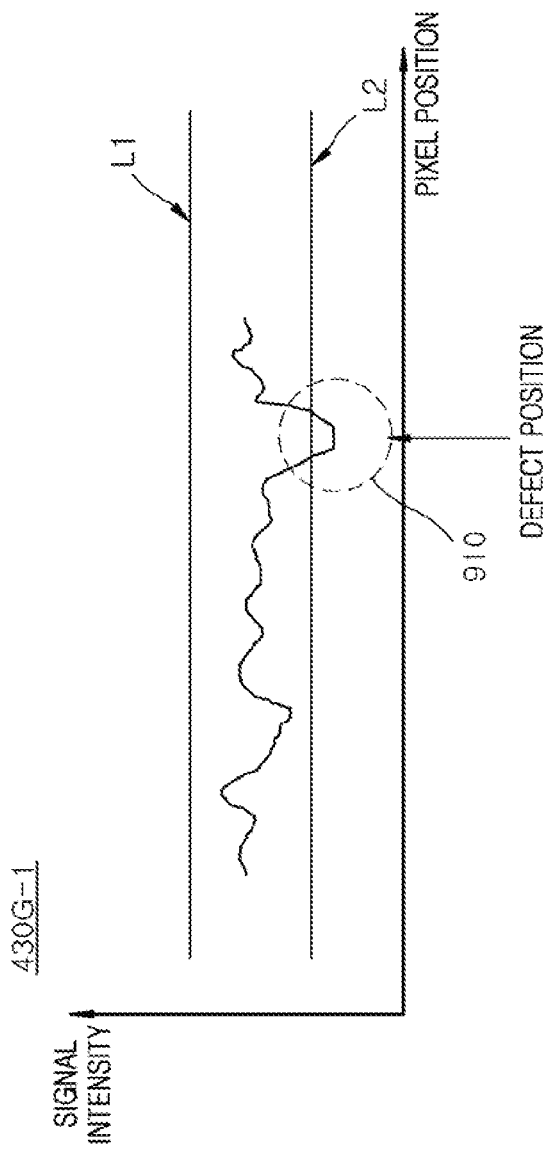
FIGS. 12 and 13 are graphs illustrating methods of detecting a printing defect and a preliminary contact hole of a photoresist pattern formed according to an embodiment.

FIG. 12 is a graph illustrating a method of detecting the printing defect (250 of FIG. 7) according to an embodiment.

Referring to FIG. 12, after a graph 430G-1 is obtained by an SEM scan over an arbitrary region of the photoresist pattern (201 of FIG. 7), the lower reference intensity threshold value L2 may be applied to the graph 430G-1 or the pixel signal intensity data. In such a case, the upper reference intensity threshold value L1 may also be applied to the graph 430G-1 or the pixel signal intensity data. Whether the graph 430G-1 includes a valley having a signal intensity value less than the lower reference intensity threshold value L2 may be discriminated. If the graph 430G-1 includes a valley 910 having a signal intensity value less than the lower reference intensity threshold value L2, a pixel position of the valley 910 may be regarded as a defect position.

The graph 430G-1 of FIG. 12 may be substantially the same as the graph 430G of FIG. 10 obtained by the SEM scan over the third region 430 illustrated in FIG. 7. Accordingly, a position of the printing defect 250 illustrated in the SEM image 301 of FIG. 7 may be substantially the same as a position of the defect which is detected by applying the lower reference intensity threshold value L2 to the graph 430G-1.

Figure 13:
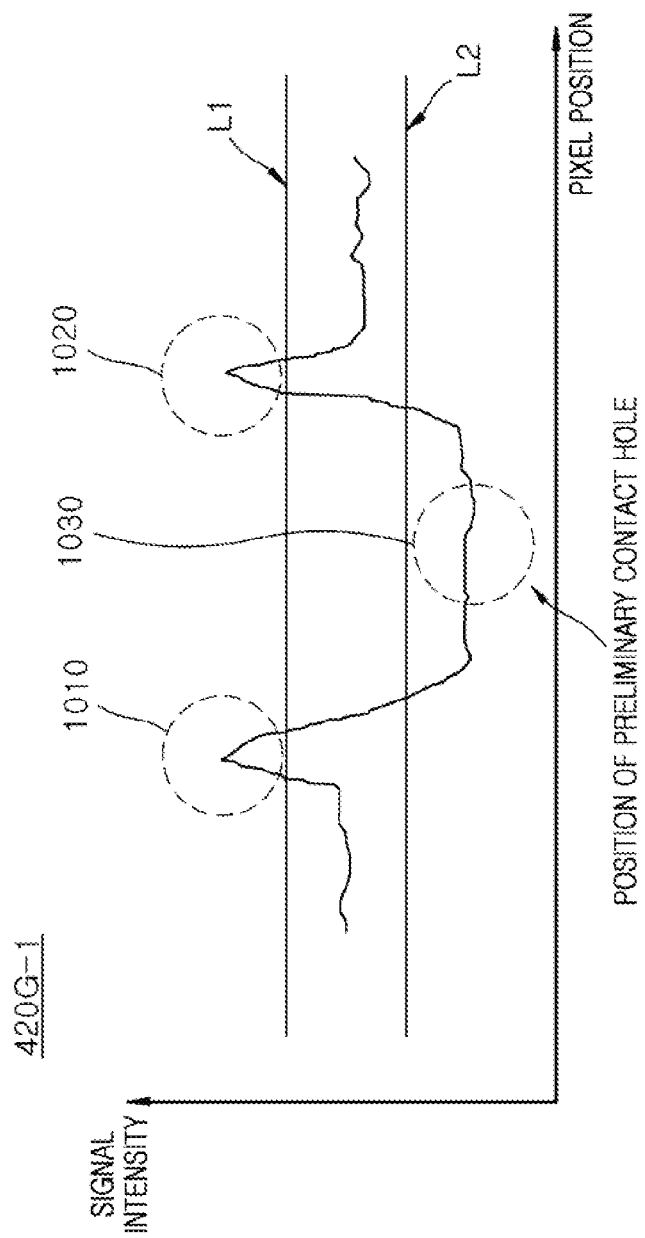

FIG. 13 is a graph illustrating a method of detecting the preliminary contact hole (240 of FIG. 7) according to an embodiment.

Referring to FIG. 13, after a graph 420G-1 is obtained by an SEM scan over an arbitrary region of the photoresist pattern (201 of FIG. 7), the lower reference intensity threshold value L2 may be applied to the graph 420G-1 or the pixel signal intensity data. In such a case, the upper reference intensity threshold value L1 may also be applied to the graph 420G-1 or the pixel signal intensity data. Whether the graph 420G-1 includes a valley having a signal intensity value less than the lower reference intensity threshold value L2 may be discriminated. In addition, whether the graph 420G-1 includes a peak having a signal intensity value greater than the upper reference intensity threshold value L1 may be discriminated. If the graph 420G-1 includes a valley 1030 having a signal intensity value less than the lower reference intensity threshold value L2 and peaks 1010 and 1020 having signal intensity values greater than the upper reference intensity threshold value L1 as illustrated in FIG. 13, the positions of the peaks 1010 and 1020 and the valley 1030 may be regarded as preliminary defect positions.

At least one of the peaks 1010 and 1020 and the valley 1030 may correspond to the printing defect (250 of FIG. 7) or another surface defect. Unlike this, at least one of the peaks 1010 and 1020 and the valley 1030 may correspond to the preliminary contact hole (240 of FIG. 7). In order to discriminate whether at least one of the peaks 1010 and 1020 and the valley 1030 corresponds to any one of the preliminary contact holes (240 of FIG. 7), the pixel positions of the peaks 1010 and 1020 and the valley 1030 may be compared with designed positions of the preliminary contact holes (240 of FIG. 7).

More specifically, whether the designed positions of the preliminary contact holes 240 extracted from design layout data are consistent with the pixel positions of the peaks 1010 and 1020 and the valley 1030 may be discriminated using the design layout data for forming the photoresist pattern (201 of FIG. 7) or the photomask (100 of FIG. 1). If the designed positions of the preliminary contact holes 240 extracted from the design layout data are consistent with the pixel positions of the peaks 1010 and 1020 and the valley 1030, the peaks 1010 and 1020 and the valley 1030 might not be regarded as a defect. If the designed positions of the preliminary contact holes 240 extracted from the design layout data are inconsistent with the pixel positions of the peaks 1010 and 1020 and the valley 1030, the peaks 1010 and 1020 and the valley 1030 may be regarded as a printing defect.

Alternatively, the signal intensity values of the pixel positions consistent with the designed positions of the preliminary contact holes 240 extracted from the design layout data may be removed or deleted from the graph 420G-1 obtained by the SEM scan over the second region 420 before the pixel positions of the peaks 1010 and 1020 and the valley 1030 are compared with the designed positions of the preliminary contact holes (240 of FIG. 7). In such a case, if the graph 420G-1 includes the peaks 1010 and 1020 and the valley 1030, the peaks 1010 and 1020 and the valley 1030 may be regarded as a printing defect.

Figure 14:
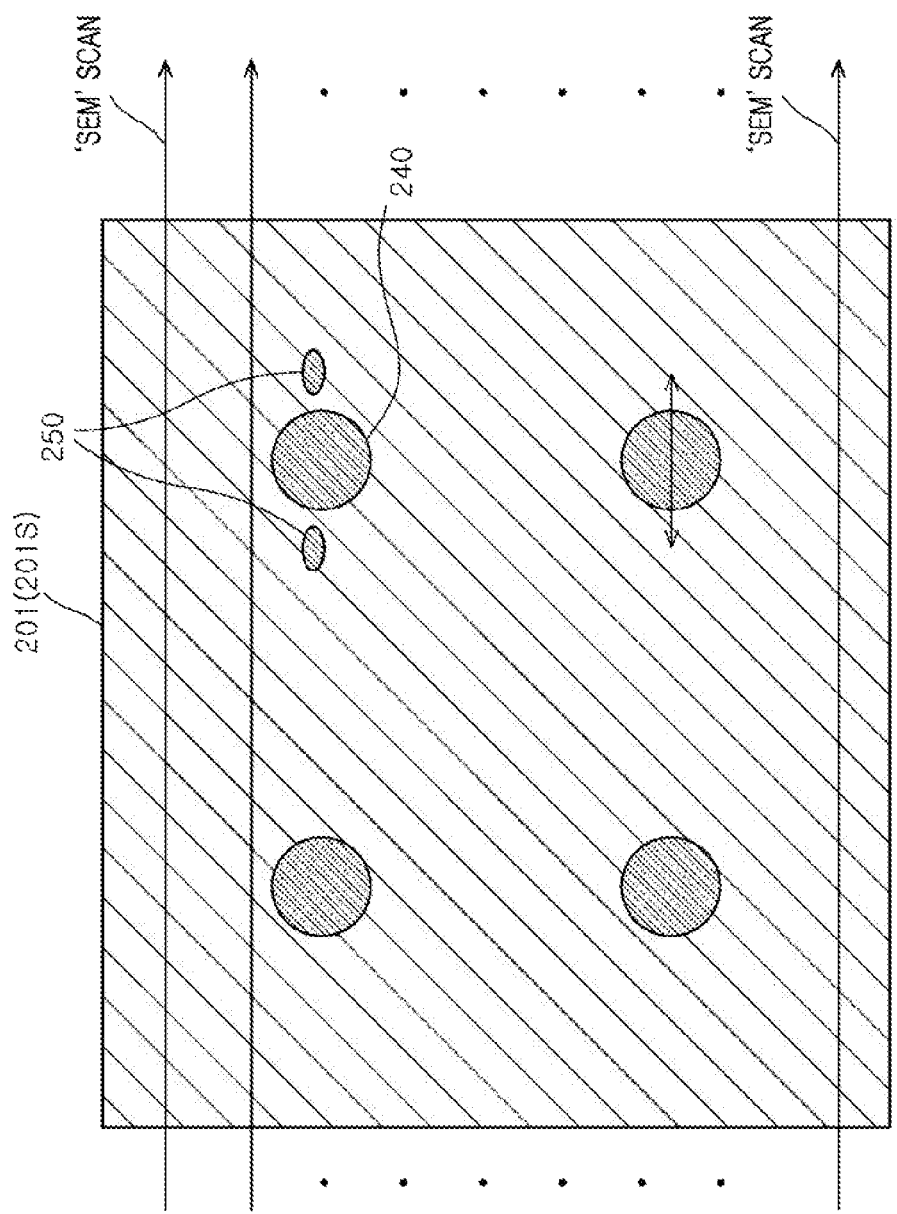
FIG. 14 is a schematic view illustrating a scanning process of an SEM for obtaining an SEM image of a photoresist pattern formed according to an embodiment.
Figure 15:
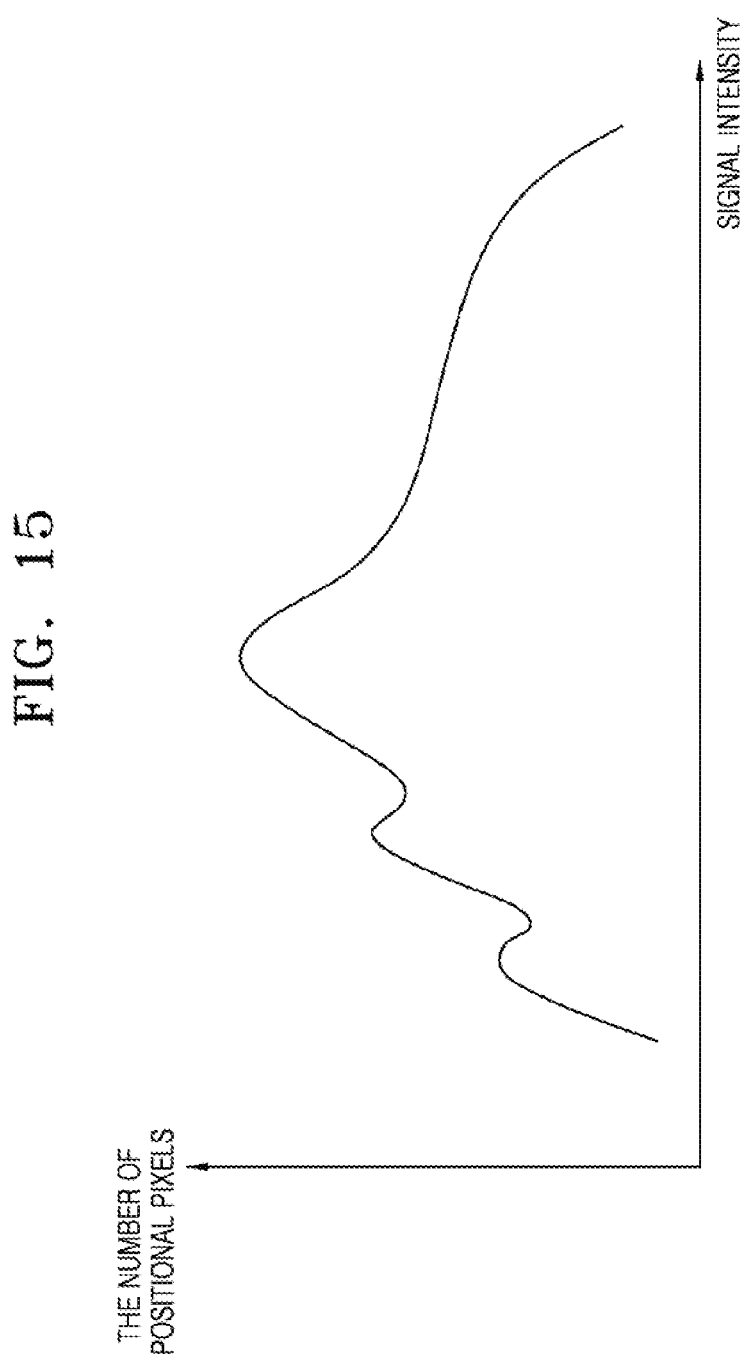
FIG. 15 is a pixel histogram obtained by the scanning process illustrated in FIG. 14.

FIG. 14 is a schematic view illustrating a process of scanning the surface 201S of the photoresist pattern 201 shown in FIG. 5 using an SEM. FIG. 15 is a pixel histogram obtained by the scanning process illustrated in FIG. 14.

Referring to FIG. 14, the SEM may scan an entire portion of the surface 201S of the photoresist pattern 201 shown in FIG. 5. While the SEM scans the surface 201S of the photoresist pattern 201, the secondary electrons emitted from the surface 201S of the photoresist pattern 201 may be detected to provide the signal intensity data according to the pixel positions. The signal intensity data may be expressed as the histogram of FIG. 15. In FIG. 15, the abscissa represents a signal intensity and the ordinate represents the number of positional pixels. The histogram of FIG. 15 may correspond to a graph illustrating the number of positional pixels relative to the signal intensity based on the signal intensity data obtained by the SEM scan. The number of positional pixels may vary according to the signal intensity.

After the histogram of FIG. 15 is obtained from the data generated by the SEM scan, the histogram of FIG. 15 may be analyzed to provide a method of setting a reference intensity for detecting the signal intensity corresponding to the printing defect (250 of FIG. 7).

Figure 16:
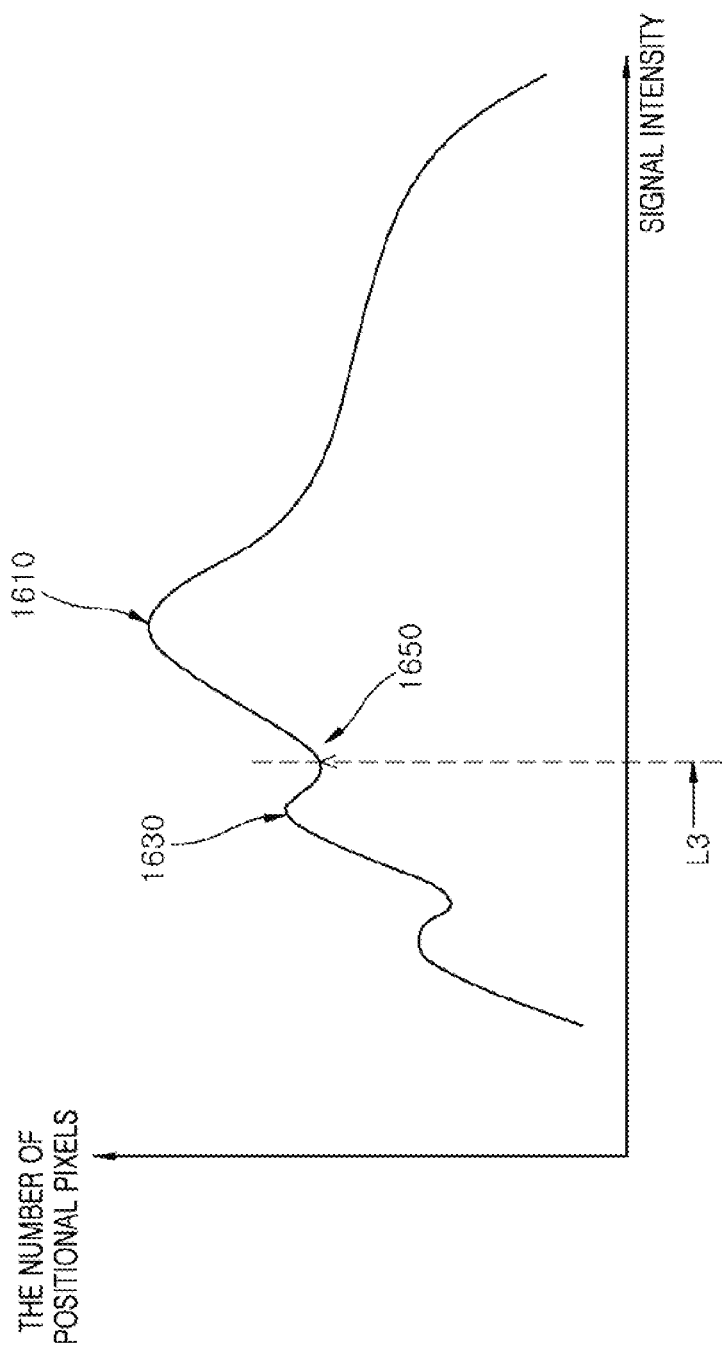
FIGS. 16 and 17 are graphs illustrating a method of determining a reference signal intensity of an SEM for detecting a printing defect of a photoresist pattern formed according to an embodiment.
Figure 17:
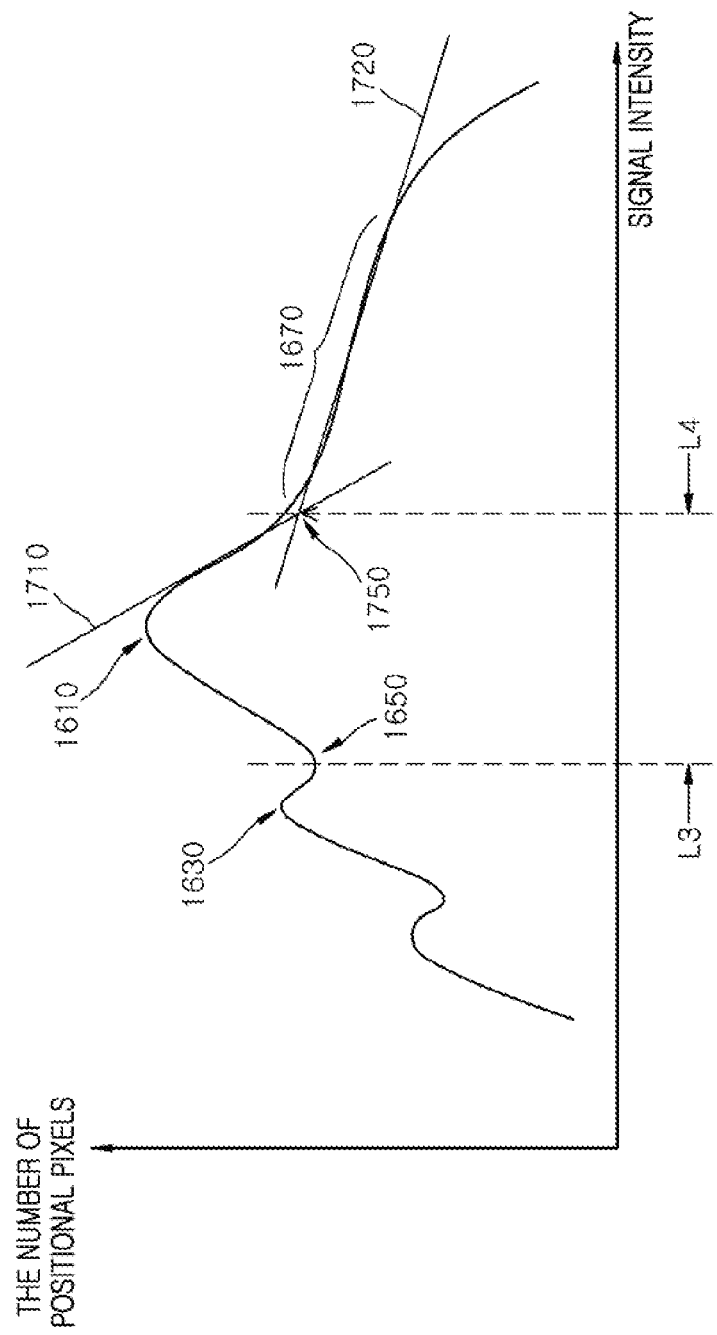

FIG. 16 is a histogram illustrating a method of setting a lower reference intensity threshold value L3 for detecting the printing defect (250 of FIG. 7) according to an embodiment. FIG. 17 is a histogram illustrating a method of setting an upper reference intensity threshold value L4 for detecting the printing defect (250 of FIG. 7) according to an embodiment. The histograms of FIGS. 16 and 17 are substantially the same graphs as the histogram of FIG. 15.

Referring to FIG. 16, the histogram may include various peaks. A first peak region 1610 corresponding to a highest peak in the histogram of FIG. 16 may denote a pixel position having the largest number of pixels. In the SEM image 301 of FIG. 7, a region having a largest area may be the first region 410. Thus, the first peak region 1610 of the histogram illustrated in FIG. 16 may correspond to a background region including the first region (410 of FIG. 7).

A second peak region 1630 may exist in a region having a signal intensity which is lower than a signal intensity of the first peak region 1610. Accordingly, the second peak region 1630 may denote a pixel position having a second largest number of pixels. That is, the second peak region 1630 may indicate bottom regions of the preliminary contact holes (240 of FIG. 7).

In the histogram between the first peak region 1610 and the second peak region 1630, a signal intensity value of a point 1650 having a minimum number of positional pixels may be set as the lower reference intensity threshold value L3. The lower reference intensity threshold value L3 may be a boundary point between a range of signal intensity values obtained from the first region (410 of FIG. 7) corresponding to the background region and a range of signal intensity values obtained from the bottom regions of the preliminary contact holes (240 of FIG. 7).

As described above, the point 1650 of the histogram illustrated in FIG. 16 may have the minimum number of positional pixels in a region between the first peak region 1610 and the second peak region 1630. Thus, the point 1650 of the histogram illustrated in FIG. 16 may be found by analyzing differential coefficients which are obtained by differentiating a function of the histogram illustrated in FIG. 16 once. That is, a point having a differential coefficient (first derivative) of zero on the curve between the first peak region 1610 and the second peak region 1630 may be set as the point 1650.

If the point having a differential coefficient of zero is absent on the curve between the first peak region 1610 and the second peak region 1630, the point 1650 of the histogram illustrated in FIG. 16 may be found by analyzing a second derivative which is obtained by differentiating a function of the histogram illustrated in FIG. 16 twice. That is, an inflection point having a second derivative value of zero on the curve between the first peak region 1610 and the second peak region 1630 may be set as the point 1650.

Referring to FIG. 17, a third peak region 1670 corresponding to a region having signal intensity values greater than a signal intensity value of the first peak region 1610 may be a region having a relatively high signal intensity value detected from sidewalls of the preliminary contact holes (240 of FIG. 7). In such a case, an inflection point 1750 may exist in a boundary region between the first peak region 1610 and the third peak region 1670. A linearity of the graph in the first peak region 1610 adjacent to the inflection point 1750 may be expressed as a first straight line 1710 having a first slope. A linearity of the graph in the third peak region 1670 adjacent to the inflection point 1750 may be expressed as a second straight line 1720 having a second slope different from the first slope. In such case, a cross point of the first straight line 1710 and the second straight line 1720 may be set as the inflection point 1750. A signal intensity value of the inflection point 1750 may be set as the upper reference intensity threshold value L4. The lower reference intensity threshold value L3 and the upper reference intensity threshold value L4 may be set to define a range of the signal intensity values detected from the first region (410 of FIG. 7) corresponding to background region.

The lower reference intensity threshold value L3 and the upper reference intensity threshold value L4 may be applied to the graphs (410G of FIG. 8, 420G of FIGS. 9 and 430G of FIG. 10) to detect defects such as the printing defects (250 of FIG. 7).

Figure 18:
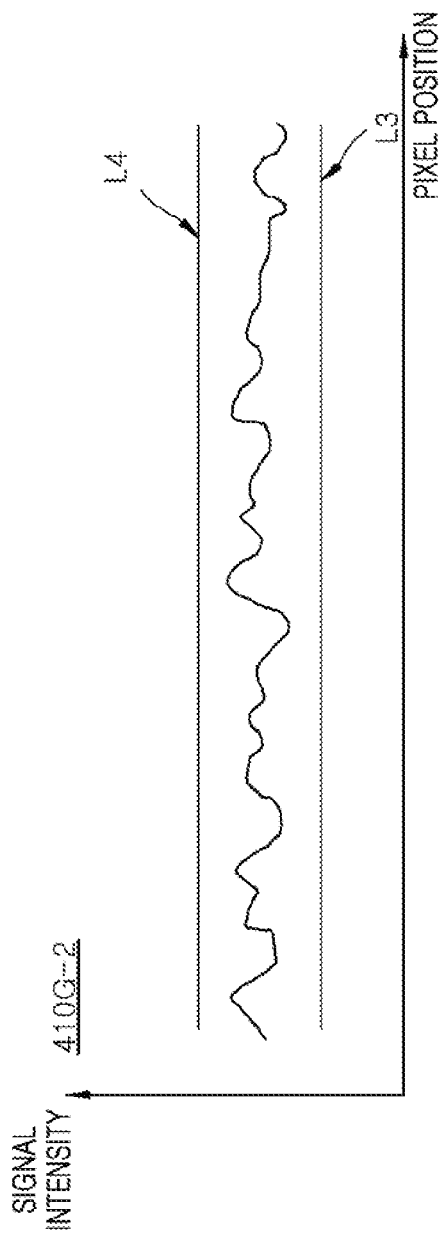
FIGS. 18, 19, and 20 are graphs illustrating a method of detecting a printing defect of a photoresist pattern formed according to an embodiment.
Figure 19:
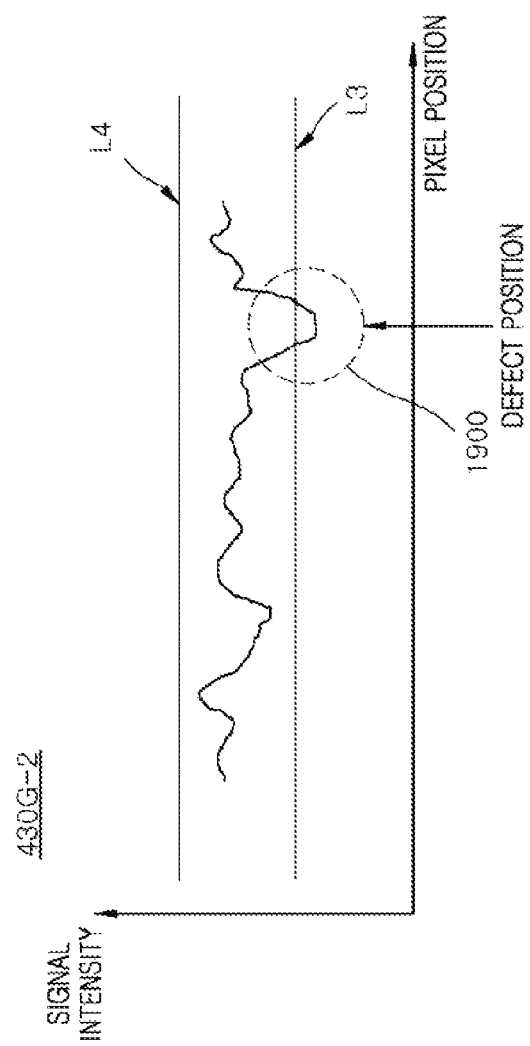
Figure 20:
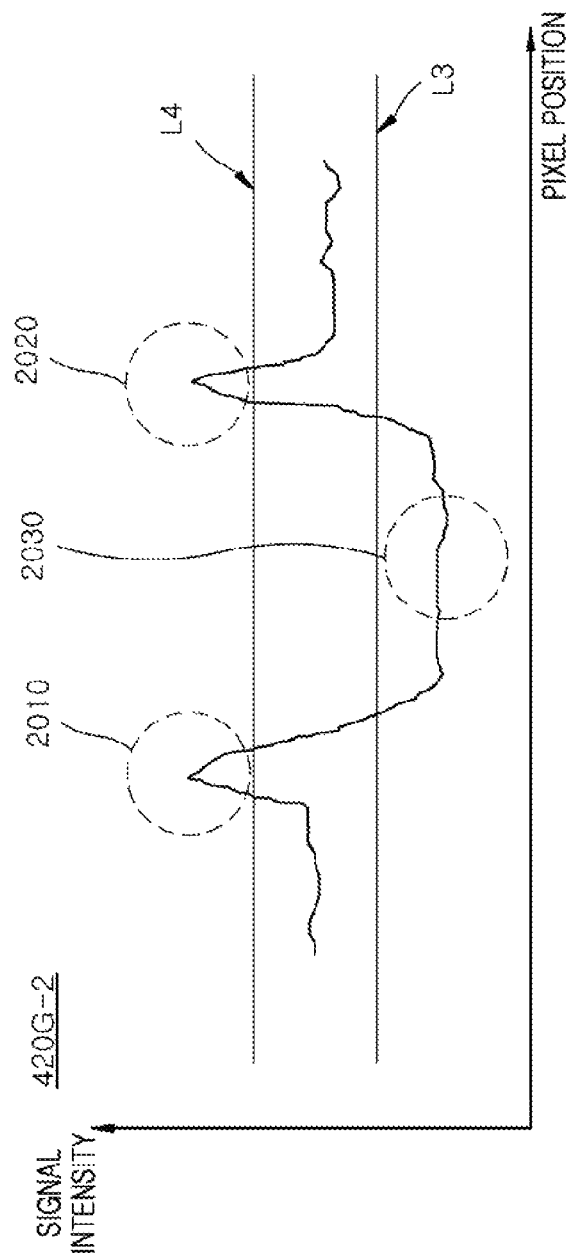

FIGS. 18, 19, and 20 are graphs illustrating a method of detecting the printing defect (250 of FIG. 7) according to an embodiment.

Referring to FIG. 18, after a graph 410G-2 is obtained by an SEM scan over an arbitrary region of the photoresist pattern (201 of FIG. 7), the lower reference intensity threshold value L3 may be applied to the graph 410G-2. In such a case, the upper reference intensity threshold value L4 may also be applied to the graph 410G-2. All of the signal intensity values of the graph 410G-2 are distributed in a range between the lower reference intensity threshold value L3 and the upper reference intensity threshold value L4. Thus, the arbitrary region of the photoresist pattern (201 of FIG. 7), for example, the first region (410 of FIG. 7) may be regarded as a background region in which no printing defect exists. In addition, the arbitrary region of the photoresist pattern (201 of FIG. 7), for example, the first region (410 of FIG. 7) may be regarded as the background region in which no other defect exists.

Referring to FIG. 19, after a graph 430G-2 is obtained by an SEM scan over an arbitrary region of the photoresist pattern (201 of FIG. 7), the lower reference intensity threshold value L3 may be applied to the graph 430G-2. In such a case, the upper reference intensity threshold value L4 may also be applied to the graph 430G-2. Whether the graph 430G-2 includes a valley having a signal intensity value less than the lower reference intensity threshold value L3 may be discriminated.

If the graph 430G-2 includes a valley 1900 having a signal intensity value less than the lower reference intensity threshold value L3, a pixel position of the valley 1900 may be regarded as a defect position. That is, the valley 1900 of the graph 430G-2 may be regarded as a region corresponding to the printing defect 250 in the third region (430 of FIG. 7). Accordingly, a position of the printing defect 250 illustrated in the SEM image 301 of FIG. 7 may be substantially consistent with the pixel position of the valley 1900 which is detected by applying the lower reference intensity threshold value L3 to the graph 430G-2.

Referring to FIG. 20, after a graph 420G-2 is obtained by an SEM scan over an arbitrary region of the photoresist pattern (201 of FIG. 7), the lower reference intensity threshold value L3 may be applied to the graph 420G-2 or the pixel signal intensity data. In such a case, the upper reference intensity threshold value L4 may also be applied to the graph 420G-2 or the pixel signal intensity data. Whether the graph 420G-2 includes a valley having a signal intensity value less than the lower reference intensity threshold value L3 may be discriminated. In addition, whether the graph 420G-2 includes a peak having a signal intensity value greater than the upper reference intensity threshold value L4 may be discriminated. If the graph 420G-2 includes a valley 2030 having a signal intensity value less than the lower reference intensity threshold value L3 and peaks 2010 and 2020 having signal intensity values greater than the upper reference intensity threshold value L4 as illustrated in FIG. 20, the positions of the peaks 2010 and 2020 and the valley 2030 may be regarded as preliminary defect positions.

At least one of the peaks 2010 and 2020 and the valley 2030 may correspond to the printing defect (250 of FIG. 7) or another surface defect. Unlike this, at least one of the peaks 2010 and 2020 and the valley 2030 may correspond to the preliminary contact hole (240 of FIG. 7). Thus, it may be necessary to discriminate whether at least one of the peaks 2010 and 2020 and the valley 2030 corresponds to the preliminary contact hole (240 of FIG. 7). In order to discriminate whether at least one of the peaks 2010 and 2020 and the valley 2030 corresponds to any one of the preliminary contact holes (240 of FIG. 7), the pixel positions of the peaks 2010 and 2020 and the valley 2030 may be compared with designed positions of the preliminary contact holes (240 of FIG. 7).

More specifically, whether the designed positions of the preliminary contact holes 240 extracted from design layout data are consistent with the pixel positions of the peaks 2010 and 2020 and the valley 2030 may be discriminated using the design layout data for forming the photoresist pattern (201 of FIG. 7) or the photomask (100 of FIG. 1). If the designed positions of the preliminary contact holes 240 extracted from the design layout data are consistent with the pixel positions of the peaks 2010 and 2020 and the valley 2030, the peaks 2010 and 2020 and the valley 2030 might not be regarded as a defect. If the designed positions of the preliminary contact holes 240 extracted from the design layout data are inconsistent with the pixel positions of the peaks 2010 and 2020 and the valley 2030, the peaks 2010 and 2020 and the valley 2030 may be regarded as a printing defect.

Alternatively, the signal intensity values of the pixel positions consistent with the designed positions of the preliminary contact holes 240 extracted from the design layout data may be removed or deleted from the graph 420G-2 obtained by the SEM scan over the second region 420 before the pixel positions of the peaks 2010 and 2020 and the valley 2030 are compared with the designed positions of the preliminary contact holes (240 of FIG. 7). In such a case, if the graph 420G-2 includes the peaks 2010 and 2020 and the valley 2030, the peaks 2010 and 2020 and the valley 2030 may be regarded as a printing defect.

Figure 21:
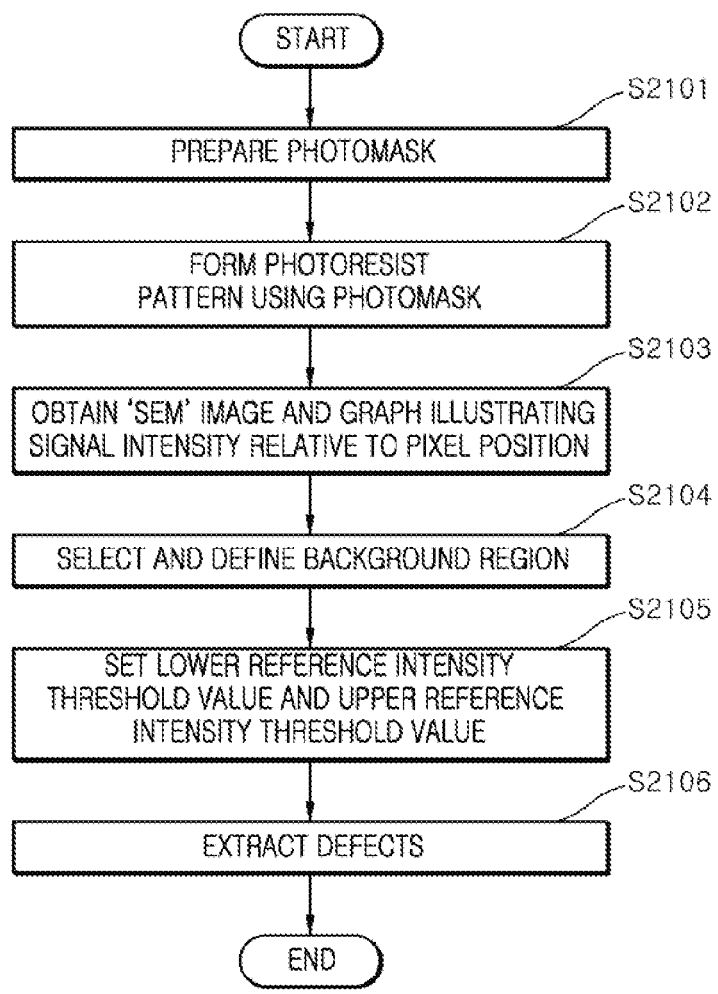
FIG. 21 is a process flowchart illustrating a method of detecting a printing defect of a photoresist pattern according to an embodiment.

FIG. 21 is a process flowchart illustrating a method of detecting a printing defect of a photoresist pattern according to an embodiment.

Referring to FIG. 21, a method of detecting a printing defect of a photoresist pattern according to an embodiment may include preparing S2101 the photomask 100 including the transfer pattern regions 140 and the SRAFs 150, as described with reference to FIGS. 1 and 2. As described with reference to FIGS. 3 and 4, the images of the transfer pattern regions 140 included in the photomask 100 may be transferred onto a photoresist layer to form S2102 the photoresist pattern (201 of FIG. 4). As described with reference to FIG. 5, the SEM may scan the surface 201S of the photoresist pattern 201 to obtain the SEM image 301 illustrated in FIG. 6 and to obtain S2103 the signal intensity data of the SEM image 301 relative to a pixel position.

As described with reference to FIGS. 7, 8, and 11, the background region without any defects, that is, the first region (410 of FIG. 7) may be selected and defined S2104 from the signal intensity data. As described with reference to FIGS. 7 and 11, the background region without any defects, that is, the first region (410 of FIG. 7) may be selected and defined from the SEM image (301 of FIG. 7) by human eyes. For an embodiment, selecting the first region as the background region amounts to determining that the first region will represent the background region, and defining the first region as the background region amounts to determining positional boundaries for the first region, for example, in terms of pixel position.

As described with reference to FIG. 11, the lower reference intensity threshold value (L2 of FIG. 11) may be set S2105 by subtracting a second margin from the lowest intensity value of the signal intensity data in the background region, and the upper reference intensity threshold value (L1 of FIG. 11) may be set S2105 by adding a first margin to the highest intensity value of the signal intensity data in the background region.

As described with reference to FIGS. 12 and 13, defects may be extracted S2106 by regarding the pixel positions having signal intensity values lower than the lower reference intensity threshold value (L2 of FIG. 12) in the signal intensity data relative to the pixel position as defect positions. Furthermore, as described with reference to FIG. 13, the pixel positions having signal intensity values higher than the upper reference intensity threshold value (L1 of FIG. 13) in the signal intensity data relative to the pixel position may also be regarded S2106 as additional defect positions. In such a case, as described with reference to FIG. 13, the signal intensity data relative to the pixel positions consistent with the designed positions of the transfer pattern regions (140 of FIG. 1) of the design layout data may be removed or deleted to prevent the preliminary contact holes (240 of FIG. 7) corresponding to the transfer pattern regions (140 of FIG. 1) from being regarded as defects. The design layout data of the transfer pattern regions (140 of FIG. 1) may be provided to fabricate the photomask 100.

Figure 22:
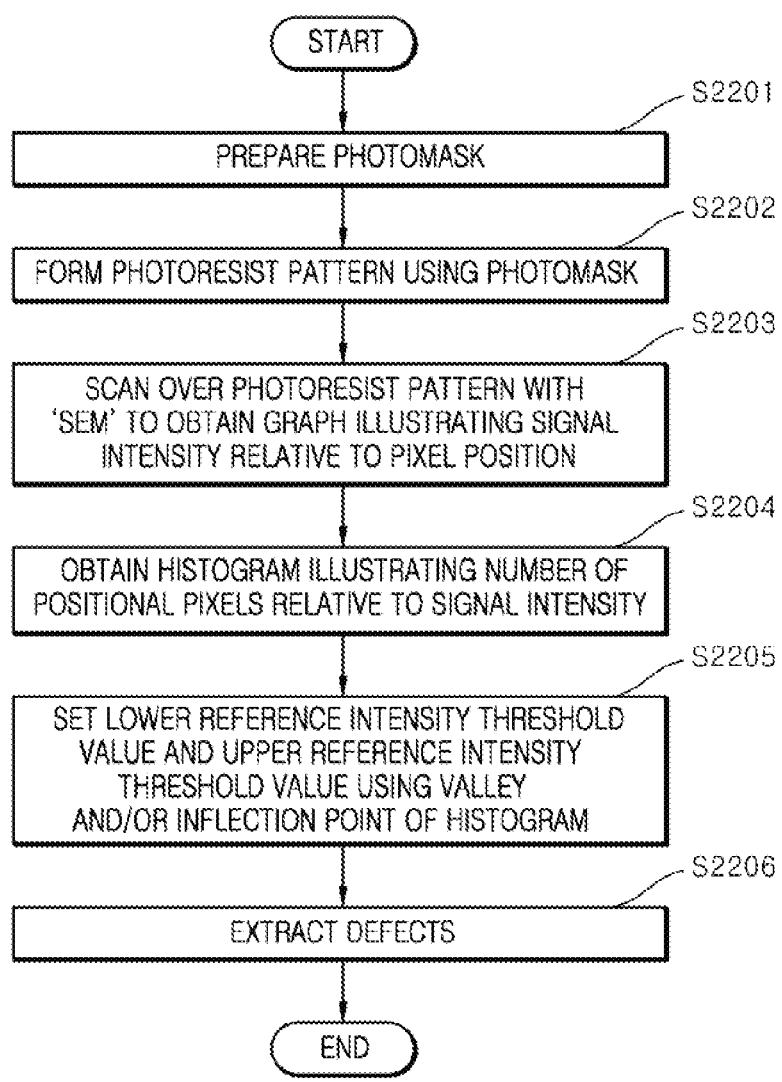
FIG. 22 is a process flowchart illustrating a method of detecting a printing defect of a photoresist pattern according to another embodiment.

FIG. 22 is a process flowchart illustrating a method of detecting a printing defect of a photoresist pattern according to another embodiment.

Referring to FIG. 22, a method of detecting a printing defect of a photoresist pattern according to another embodiment may include preparing S2201 the photomask 100 including the transfer pattern regions 140 and the SRAFs 150, as described with reference to FIGS. 1 and 2. As described with reference to FIGS. 3 and 4, the images of the transfer pattern regions 140 included in the photomask 100 may be transferred onto a photoresist layer to form S2202 the photoresist pattern (201 of FIG. 4). As described with reference to FIGS. 5 and 14, the SEM may scan S2203 the surface 201S of the photoresist pattern 201 to obtain the SEM image 301 illustrated in FIG. 6 and to obtain the signal intensity data of the SEM image 301 relative to a pixel position.

As described with reference to FIG. 15, a histogram illustrating the number of positional pixels relative to signal intensity may be obtained S2204 from the signal intensity data including the pixel positions.

As described with reference to FIG. 16, In the histogram between the first peak region 1610 having a first highest peak point and the second peak region 1630 having a second highest peak point, the point 1650 having a minimum number of positional pixels may be determined and a signal intensity value of the point 1650 may be set S2205 as the lower reference intensity threshold value L3. The point 1650 of the histogram illustrated in FIG. 16 may be determined by analyzing differential coefficients which are obtained by differentiating a function of the histogram illustrated in FIG. 16 once. That is, a point having a differential coefficient of zero on the curve between the first peak region 1610 and the second peak region 1630 may be set as the point 1650. Alternatively, an inflection point having a second derivative of zero may be determined on the curve between the first peak region 1610 and the second peak region 1630, and the inflection point may be set as the point 1650.

As described with reference to FIG. 17, a function of the histogram in the third peak region 1670 having signal intensity values greater than signal intensity values of the first peak region 1610 may be differentiated twice to obtain a second derivative of the histogram of FIG. 17, and a point having the second derivative of zero may be set as the infection point 1750. A signal intensity value of the inflection point 1750 may be set S2205 as the upper reference intensity threshold value L4. As described above, the infection point 1750 may be founded out by differentiating the function of the histogram in the third peak region 1670 twice to obtain a second derivative and by selecting a point having the second derivative of zero.

As described with reference to FIG. 19, the valley 1900 having a signal intensity value less than the lower reference intensity threshold value L3 may be regarded as defect, and a pixel position of the valley 1900 may be regarded as a defect position (see S2206). As described with reference to FIG. 20, if a peak region having signal intensity values greater than the upper reference intensity threshold value L4 exists in the signal intensity data, the peak region may also be regarded as a defect. As described with reference to FIG. 20, the signal intensity data relative to the pixel positions consistent with the designed positions of the transfer pattern regions (140 of FIG. 1) of the design layout data may be removed or deleted to prevent the preliminary contact holes (240 of FIG. 7) corresponding to the transfer pattern regions (140 of FIG. 1) from being regarded as defects. The design layout data of the transfer pattern regions (140 of FIG. 1) may be provided to fabricate the photomask 100.

A method of detecting a defect of a photoresist pattern according to an embodiment may include obtaining the SEM image 301 of the surface (201S of FIG. 5) of the photoresist pattern (201 of FIG. 5) and the signal intensity data relative to a pixel position (see the descriptions of FIGS. 5, 6, 7, and 11) and setting the lower reference intensity threshold value and the upper reference intensity threshold value used as a reference values for detecting a defect (see the descriptions of the FIGS. 11, 16, and 17). As described with reference to FIGS. 12, 13, 18, 19, and 20, the signal intensity data having signal intensity values less than the lower reference intensity threshold value or greater than the upper reference intensity threshold value may be regarded as defective data, and the pixel positions of the defective data may be regarded as defect positions.

According to the embodiments described above, the signal intensity data of the SEM image may be analyzed to provide methods of accurately and quickly detecting printing defects of a photoresist pattern.

Various embodiments of the present disclosure have been described with reference to the accompanying drawings. However, the embodiments described herein are for illustrative purposes only and are not intended to limit the scope of the present disclosure. Those skilled in the art will appreciate that various modifications, additions and substitutions are possible, without departing from the scope and spirit of the present disclosure and the accompanying claims.

What is claimed is:

1. A method of detecting defects of a photoresist pattern, the method comprising:
   providing a photomask having transfer pattern regions and sub-resolution assist features (SRAFs);
   forming a photoresist pattern using the photomask;
   scanning a surface of the photoresist pattern with a scanning electron microscope (SEM) to generate signal intensity data relative to pixel position of the surface of the photoresist pattern;
   generating a histogram illustrating the number of positional pixels relative to signal intensity from the signal intensity data including information on the pixel positions;
   setting a signal intensity value of a first point having the minimum number of positional pixels in the histogram between a first peak region having a first highest peak point and a second peak region having a second highest peak point as a lower reference intensity threshold value; and
   classifying a pixel position of the signal intensity data having a signal intensity value less than the lower reference intensity threshold value as a defect position.

2. The method of claim 1, further comprising providing design layout data of the transfer pattern regions,
   wherein classifying the pixel position of the signal intensity data further comprises removing or deleting data associated with designed positions of the transfer pattern regions of the design layout data from the signal intensity data.

3. The method of claim 1, wherein a defect at the defect position is formed by a phenomenon wherein the SRAFs are undesirably transferred onto a photoresist layer coated on a wafer.

4. The method of claim 1, wherein the first point is set as a point having a differential coefficient of zero among differential coefficients of the histogram between the first peak point and the second peak point.

5. The method of claim 1, wherein the first point is set as an inflection point having a second derivative value of zero among second derivative values of the histogram between the first peak point and the second peak point.

6. The method of claim 1, further comprising:
- setting a signal intensity value of an inflection point of the histogram between the first peak region and a third peak region having signal intensity values greater than the signal intensity value of the first peak region as an upper reference intensity threshold value; and
- classifying a pixel position of the signal intensity data having a signal intensity value greater than the upper reference intensity threshold value as an additional defect position.

\* \* \* \* \*